(12) United States Patent
Tomita et al.

(10) Patent No.: US 11,329,630 B2
(45) Date of Patent: May 10, 2022

(54) SWITCH MODULE

(71) Applicant: Murata Manufacturing Co., Ltd., Kyoto (JP)

(72) Inventors: Takayuki Tomita, Kyoto (JP); Daisuke Watanabe, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 148 days.

(21) Appl. No.: 16/849,076

(22) Filed: Apr. 15, 2020

(65) Prior Publication Data

US 2020/0244251 A1    Jul. 30, 2020

Related U.S. Application Data

(63) Continuation-in-part of application No. 16/816,545, filed on Mar. 12, 2020, now abandoned, which is a continuation-in-part of application No. 16/208,734, filed on Dec. 4, 2018, now abandoned, which is a continuation of application No. 15/493,205, filed on Apr. 21, 2017, now Pat. No. 10,181,839.

(30) Foreign Application Priority Data

May 12, 2016  (JP) ................................. 2016-096032

(51) Int. Cl.
    *H03H 9/72* (2006.01)
    *H03H 9/64* (2006.01)
    *H03H 7/40* (2006.01)
    *H03H 9/00* (2006.01)

(52) U.S. Cl.
    CPC ............. *H03H 9/725* (2013.01); *H03H 7/40* (2013.01); *H03H 9/0009* (2013.01); *H03H 9/64* (2013.01)

(58) Field of Classification Search
    CPC .. H03H 7/40; H03H 9/64; H03H 9/72; H03H 9/725
    See application file for complete search history.

(56) References Cited

U.S. PATENT DOCUMENTS

| | | | |
|---|---|---|---|
| 7,847,655 B2 | 12/2010 | Otani et al. | |
| 8,478,334 B2 | 7/2013 | Iwai | |
| 8,736,335 B2 | 5/2014 | Oshima | |
| 9,118,302 B2* | 8/2015 | Shimizu | ................. H03H 7/461 |
| 9,705,203 B2 | 7/2017 | Khlat | |
| 10,181,839 B2 | 1/2019 | Tomita et al. | |

(Continued)

FOREIGN PATENT DOCUMENTS

| | | |
|---|---|---|
| JP | 2004-140696 A | 5/2004 |
| JP | 2008-271169 A | 11/2008 |

(Continued)

OTHER PUBLICATIONS

Japanese Office action for 2016-096032 dated Feb. 4, 2020.

*Primary Examiner* — Dean O Takaoka
(74) *Attorney, Agent, or Firm* — Pearne & Gordon LLP

(57) ABSTRACT

A switch module includes a first terminal, first and second filters, and first and second switches. Impedance of the first filter for a signal in a stop band is capacitive. When the first switch is turned OFF, impedance of the first switch is capacitive, and impedance of the first filter seen from an end portion of the first switch connected to the first filter is not in a short state and impedance of the first filter seen from the first terminal is in an open state.

15 Claims, 22 Drawing Sheets

<FIRST MODIFIED EXAMPLE OF FIRST EMBODIMENT>

(56) References Cited

U.S. PATENT DOCUMENTS

| | | | |
|---|---|---|---|
| 10,382,009 B2 * | 8/2019 | Nosaka | ........... H04B 1/006 |
| 2002/0016183 A1 | 2/2002 | Lehtinen | |
| 2010/0117713 A1 | 5/2010 | Katoh et al. | |
| 2011/0260806 A1 | 10/2011 | Takeuchi | |
| 2014/0043206 A1 | 2/2014 | Ahn | |
| 2014/0118053 A1 | 5/2014 | Matsuno | |
| 2015/0018043 A1 | 1/2015 | Taniuchi | |
| 2015/0133067 A1 | 5/2015 | Chang | |
| 2015/0303973 A1 | 10/2015 | Wloczysiak | |
| 2016/0006409 A1 | 1/2016 | Keane | |
| 2016/0226484 A1 | 8/2016 | Lu | |

FOREIGN PATENT DOCUMENTS

| | | |
|---|---|---|
| JP | 2010-114837 A | 5/2010 |
| JP | 2014-093610 A | 5/2014 |
| JP | 2015-029233 A | 2/2015 |
| KR | 10-2015-0042808 A | 4/2015 |
| WO | 2010/053131 A1 | 5/2010 |

\* cited by examiner

FIG. 5A  <FIRST EMBODIMENT>
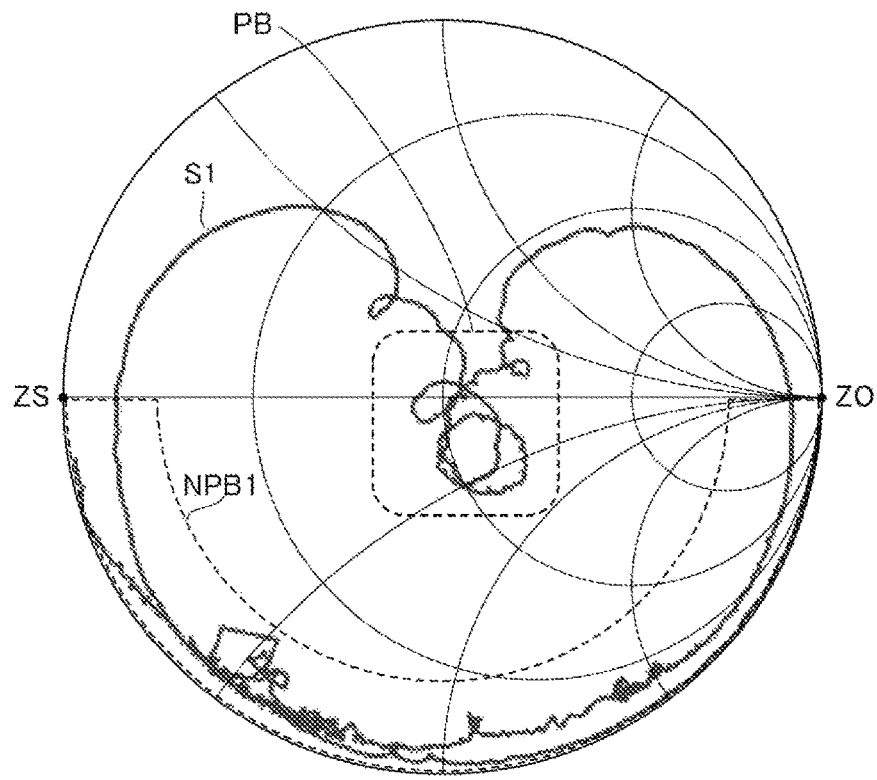
FIG. 5B  <SECOND COMPARATIVE EXAMPLE>
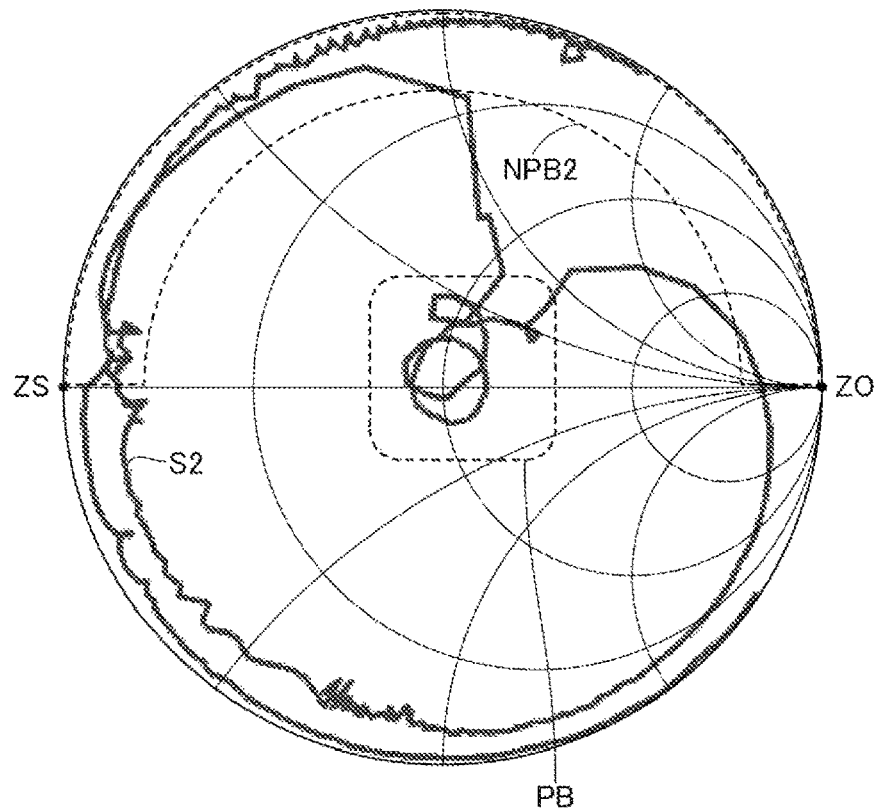

<SECOND COMPARATIVE EXAMPLE>

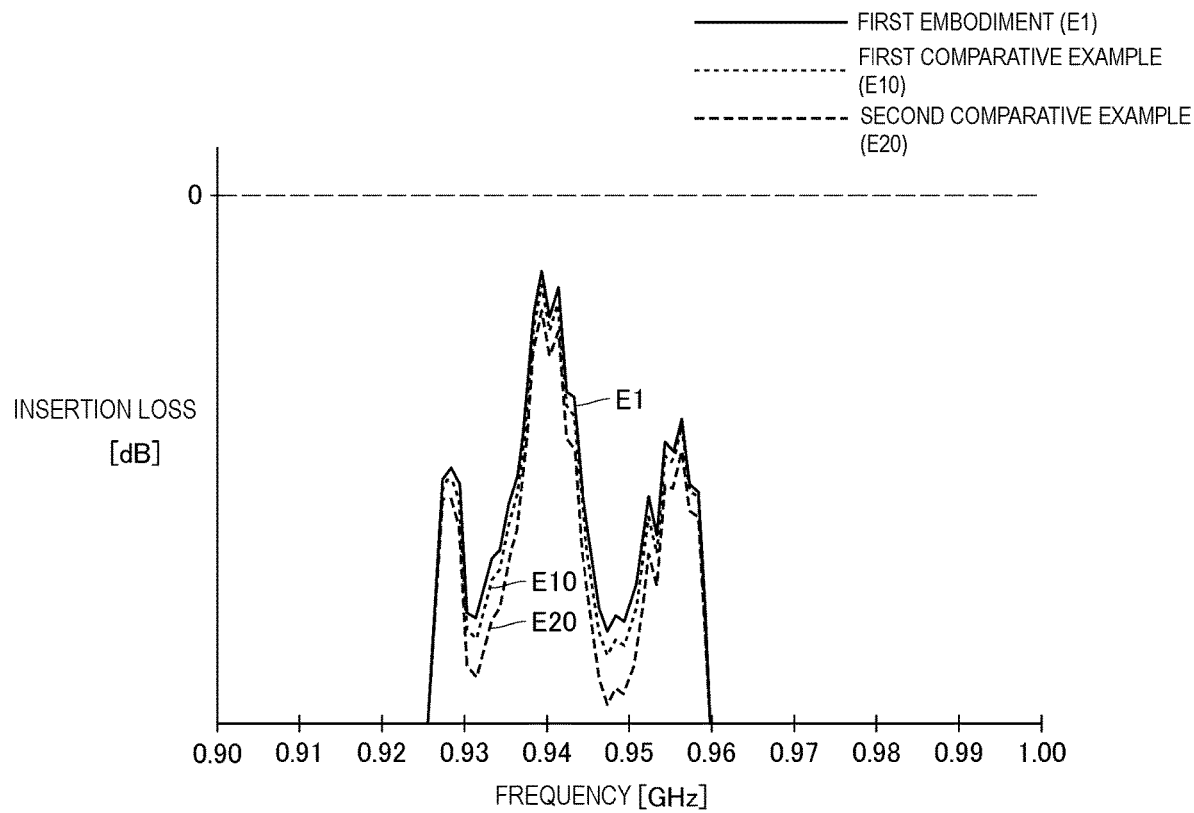

<FIRST MODIFIED EXAMPLE OF FIRST EMBODIMENT>

<SECOND MODIFIED EXAMPLE OF FIRST EMBODIMENT>

<FIRST MODIFIED EXAMPLE OF SECOND EMBODIMENT>

<SECOND MODIFIED EXAMPLE OF SECOND EMBODIMENT>

<FOURTH EMBODIMENT>

<MODIFIED EXAMPLE OF FOURTH EMBODIMENT>

<FIFTH EMBODIMENT>

<THIRD MODIFIED EXAMPLE OF FIFTH EMBODIMENT>

SWITCH MODULE

CROSS-REFERENCE TO RELATED APPLICATIONS

This is a continuation-in-part of U.S. patent application Ser. No. 16/816,545 filed on Mar. 12, 2020, which is a continuation-in-part of U.S. patent application Ser. No. 16/208,734 filed on Dec. 4, 2018, which is a continuation of U.S. patent application Ser. No. 15/493,205 filed on Apr. 21, 2017, which claims priority from Japanese Patent Application No. 2016-096032 filed on May 12, 2016. The contents of these applications are incorporated herein by reference in their entireties.

BACKGROUND

The present invention relates to a switch module that switches between signal paths in accordance with the frequency band.

Electronic devices that transmit and receive signals by using multiple frequency bands are known. In such electronic devices, a switch module that switches between signal paths in accordance with the frequency band may be used. In this switch module, a signal of a certain frequency band may leak from a terminal other than a target output terminal. This may cause a device or a circuit connected to such a terminal to malfunction. In order to improve the performance of such a switch module, it is necessary to enhance isolation characteristics representing the degree of isolation between terminals.

Japanese Unexamined Patent Application Publication No. 2004-140696 discloses a single-pole n-throw (SPnT) radio-frequency switch circuit that switches between plural receive output terminals and a transmit input terminal. In this radio-frequency switch circuit, a switch is disposed between a receive output terminal and a receive circuit to turn a radio-frequency signal ON/OFF. When a transmit signal is input from a transmit circuit, this switch is turned OFF. This configuration makes it possible to reduce a leakage of a transmit signal into a receive circuit and to enhance isolation characteristics of the radio-frequency switch circuit.

BRIEF SUMMARY

In the above-described configuration, in order to more reliably prevent a signal leakage by turning OFF the switch, a shunt-connected switch is usually provided between a signal path and a ground point. For example, Japanese Unexamined Patent Application Publication No. 2014-93610 discloses a radio-frequency switch circuit including shunt-connected switches that connect a signal path and a ground point. In this radio-frequency switch circuit, the shunt-connected switches are turned ON so that the input impedance will be made to be almost 0 to cause impedance mismatching, thereby eliminating the influence of the impedance of a circuit connected to the radio-frequency switch circuit. In the radio-frequency switch circuit disclosed in this publication, a SPnT switch module including shunt-connected switches provided in a signal path from a common terminal P1 to input/output terminals P2 through P7 is provided.

FIG. 14 is a circuit diagram of the radio-frequency switch circuit shown in FIG. 13 of this publication. As shown in FIG. 14, the shunt-connected switch disposed between the common terminal P1 and the input/output terminal P6 that is electrically connected to the common terminal P1 is turned OFF. In contrast, the shunt-connected switches disposed between the common terminal P1 and the input/output terminals P2 through P5 and P7 that are electrically disconnected from the common terminal P1 are turned ON. When a signal of a certain frequency band passes between the common terminal P1 and the input/output terminal P6, series-connected switches disposed on the signal paths of OFF ports are turned OFF and the associated shunt-connected switches are turned ON. With this configuration, the impedance of the input/output terminals on the OFF ports seen from the common terminal P1 is not influenced by the characteristic impedance of the devices connected to the input/output terminals. That is, the impedance of each input/output terminal seen from the common terminal P1 is not influenced by the characteristic impedance of a device connected to the input/output terminal because of the effect of the associated shunt-connected switch that is turned ON, and is determined by the capacitance of the series-connected switch that is turned OFF.

As in the switch module disclosed in this publication, a shunt-connected switch may be disposed on a signal path from a common terminal P1 to each input/output terminal. In this case, in order to reduce the insertion loss, which may occur when a certain series-connected switch is turned ON, the capacitance of another series-connected switch that is turned OFF may be decreased so that power of leakage which may occur via this capacitance can be reduced. However, decreasing of the capacitance of a series-connected switch that is turned OFF increases the resistance of this series-connected switch when it is turned ON, thereby increasing the insertion loss of this series-connected switch. In this manner, the capacitance of a series-connected switch that is turned OFF and the resistance of this series-connected switch that is turned ON have a tradeoff relationship. It is difficult to find suitable values of the capacitance and the resistance of a series-connected switch which may contribute to reducing the insertion loss of the overall switch module. It is thus difficult to reduce the insertion loss of a switch module including shunt-connected switches.

The present disclosure has been made in view of the above-described background. The present disclosure reduces insertion loss of a switch module.

According to an embodiment of the present disclosure, there is provided a switch module including a first terminal, first and second filters, and first and second switches. The first filter is configured to pass a signal in a first frequency band and stop a signal in a second frequency band from passing through the first filter. The first switch selectively connects the first terminal to the first filter. The second filter is configured to pass a signal in a third frequency band. The third frequency band is included in the second frequency band. The second switch selectively connects the first terminal to the second filter. Impedance of the first filter for a signal in the second frequency band is capacitive. When the first switch is turned OFF, impedance of the first switch is capacitive, and impedance of the first filter seen from an end portion of the first switch connected to the first filter is not in a short state and impedance of the first filter seen from the first terminal is in an open state.

The short state is a state in which impedance is as low as almost zero. The open state is a state in which impedance is as high as being almost infinite.

In a switch module according to an embodiment of the present disclosure, the impedance of the first filter seen from an end portion of the first switch connected to the first filter is not to be made in the short state, thereby making it possible to reduce the insertion loss of the switch module.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 5A is a Smith chart representing simulation results of an impedance change of a SAW filter in the first embodiment;

FIG. 5B is a Smith chart representing simulation results of an impedance change of a filter in a second comparative example;

FIG. 7 is a graph representing the insertion loss of the switch modules of the first embodiment and the first and second comparative examples;

DETAILED DESCRIPTION

Figure 1:
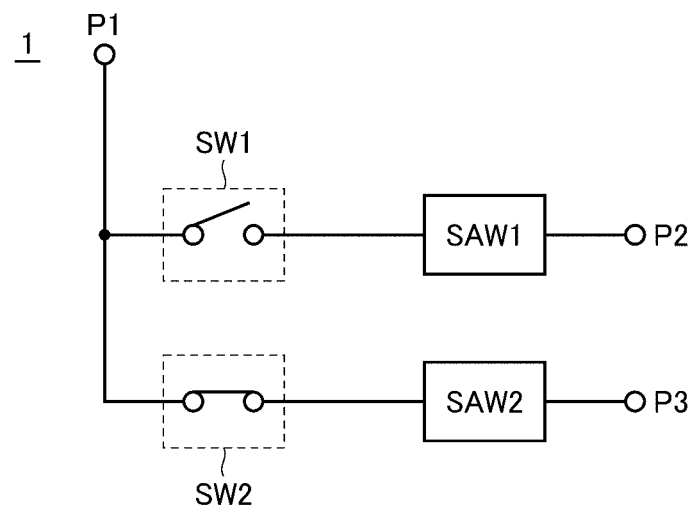
FIG. 1 is a circuit diagram of a switch module according to a first embodiment.

Embodiments of the present disclosure will be described below in detail with reference to the accompanying drawings. In the drawings, the same elements or similar elements are designated by like reference numerals, and an explanation thereof will be provided only once.

First Embodiment

FIG. 1 is a circuit diagram of a switch module 1 according to a first embodiment. As shown in FIG. 1, the switch module 1 includes a common terminal P1, input/output terminals P2 and P3, first and second filters SAW1 and SAW2, which are surface acoustic wave (SAW) filters, and first and second switches SW1 and SW2. The pass band of the second filter SAW2 is included in the stop band of the first filter SAW1. The switch module 1 is a single-pole double-throw (SPDT) switch module. Alternatively, the switch module 1 may be a SPnT (n is three or greater) switch module.

The common terminal P1 corresponds to a first terminal of an embodiment of the disclosure. The pass band of the first filter SAW1 corresponds to a first frequency band of an embodiment of the disclosure, and the stop band of the first filter SAW1 corresponds to a second frequency band of an embodiment of the disclosure. The pass band of the second filter SAW2 corresponds to a third frequency band of an embodiment of the disclosure. The pass band of the first filter SAW1 does not overlap that of the second filter SAW2.

On a path from the common terminal P1 to the input/output terminal P2, the first switch SW1 and the first filter SAW1 are connected in this order. The first switch SW1 switches between electrical connection and disconnection between the common terminal P1 and the first filter SAW1.

On a path from the common terminal P1 to the input/output terminal P3, the second switch SW2 and the second filter SAW2 are connected in this order. The second switch SW2 switches between electrical connection and disconnection between the common terminal P1 and the second filter SAW2.

The first and second switches SW1 and SW2 include field effect transistors (FETs), for example. The ON/OFF state of the first and second switches SW1 and SW2 is controlled by a controller (not shown). The configuration of switches, which will be discussed later, is also similar to that of the first and second switches SW1 and SW2.

The impedance of the first filter SAW1 for a signal in the stop band is capacitive. The impedance of the second filter SAW2 for a signal in the stop band is also capacitive. The impedance of SAW filters, which will be discussed later, for a signal in the stop band is also capacitive.

In FIG. 1, the first switch SW1 is turned OFF, while the second switch SW2 is turned ON. The ON/OFF states of the first and second switches SW1 and SW2 are set in this manner when, for example, signals are received from an antenna connected to the common terminal P1 and a signal in the pass band of the second filter SAW2 is output from the input/output terminal P3.

Figure 2:
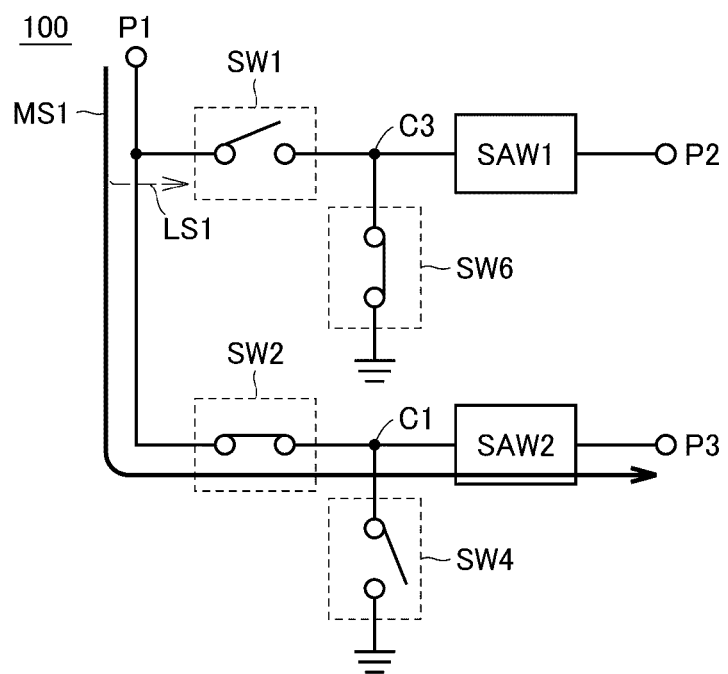
FIG. 2 is a circuit diagram of a switch module according to a first comparative example.

FIG. 2 is a circuit diagram of a switch module 100 according to a first comparative example. The difference between the switch module 100 and the switch module 1 is that the switch module 100 includes fourth and sixth switches SW4 and SW6 as shunt-connected switches. The configurations of the other elements are similar to those of the switch module 1, and an explanation thereof will thus be omitted.

The fourth switch SW4 switches between electrical connection and disconnection between a ground point and a first node C1 between the second switch SW2 and the second filter SAW2. The fourth switch SW4 is turned OFF when the second switch SW2 is turned ON. The fourth switch SW4 is turned ON when the second switch SW2 is turned OFF. In FIG. 2, the second switch SW2 is ON and the fourth switch SW4 is OFF.

The sixth switch SW6 switches between electrical connection and disconnection between a ground point and a third node C3 between the first switch SW1 and the first filter SAW1. The sixth switch SW6 is turned OFF when the first switch SW1 is turned ON. The sixth switch SW6 is turned ON when the first switch SW1 is turned OFF. In FIG. 2, the first switch SW1 is OFF and the sixth switch SW6 is ON.

When a signal MS1 in the pass band of the second filter SAW2 passes between the common terminal P1 and the input/output terminal P3, it partially leaks to the first switch SW1 as a signal LS1 even though the first switch SW1 is OFF. In this case, without the sixth switch SW6, the first switch SW1 (OFF) does not become the ideal open state and is regarded as a capacitance, instead. Thus, the impedance seen from the third node C is influenced by the impedance of the first filter SAW1. To eliminate the influence of the impedance of the first filter SAW1, the sixth switch SW6 is disposed at the third node C3 for switching between electrical connection and disconnection between the third node C3 and a ground point. When the first switch SW1 is turned OFF, the sixth switch SW6 is turned ON so that the impedance seen from the third node C3 can be made in the short state, thereby eliminating the influence of the impedance of the first filter SAW1. That is, the impedance of the input/output terminal P2 seen from the common terminal P1 is determined by the characteristic impedance of the first switch SW1 that is turned OFF.

In order to reduce the insertion loss, which may occur when the second switch SW2 is turned ON, the capacitance of the first switch SW1 that is tuned OFF may be decreased so that power of leakage which may occur via this capacitance can be reduced. To decrease the capacitance of the first switch SW1 that is turned OFF, it is necessary to reduce the size of a transistor (for example, the gate width of a FET) used in the first switch SW1. However, decreasing of the size of the transistor increases the resistance of the first switch SW1 when it is turned ON, thereby increasing the insertion loss of the first switch SW1. In this manner, the capacitance of the first switch SW1 that is turned OFF and the resistance of the first switch SW1 that is turned ON have a tradeoff relationship.

In the first embodiment, attention is focused on the fact that the impedance of a series-connected switch that is turned OFF and the impedance of a SAW filter for a signal in the stop band are both capacitive (the imaginary part of the impedance is negative). Then, without the use of shunt-connected switches, the impedance of the first filter SAW1 seen from the common terminal P1 can be represented by the combined impedance of the impedance of the first filter SAW1 that is turned OFF and the impedance of the first filter SAW1 for a signal in the stop band. With this configuration, the impedance of the first filter SAW1 seen from the common terminal P1 can be made in the open state.

Referring back to FIG. 1, the impedance of the first switch SW1 that is turned OFF is capacitive. The impedance of the first filter SAW1 seen from the end portion of the first switch SW1 connected to the first filter SAW1 is not in the short state, and the impedance of the first filter SAW1 seen from the common terminal P1 is in the open state. With this configuration, the impedance of a signal path from the common terminal P1 to an input/output terminal via an associated switch that is turned OFF is not in the short state, but in the open state.

A leakage of a signal into a signal path including a switch that is turned OFF becomes smaller as the impedance of this signal path is closer to the open state. Even without a shunt-connected switch, making the impedance of a signal path be closer to the open state can prevent a signal leakage from a terminal connected to this signal path and thus reduce the insertion loss.

In the first embodiment, it is possible to reduce the insertion loss of the switch module 1.

In order to show how the impedance of the switch module 1 of the first embodiment differs from that of the impedance module 100 of the first comparative example, the impedance of the switch module 100 will first be explained with reference to FIGS. 3A and 3B, and then, the impedance of the switch module 1 will be explained with reference to FIGS. 4A and 4B.

Figure 3A:
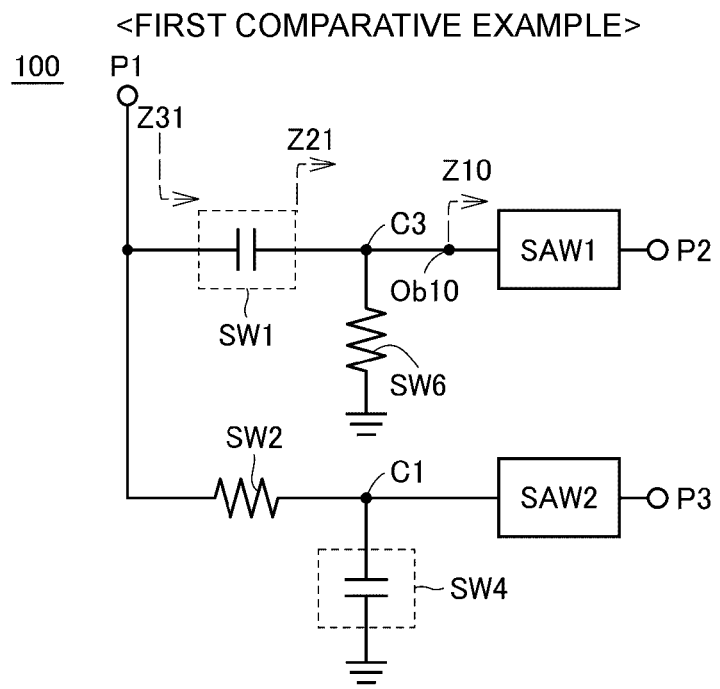
FIG. 3A is an equivalent circuit diagram of the switch module according to the first comparative example shown in FIG. 2.

FIG. 3A is an equivalent circuit diagram of the switch module 100 shown in FIG. 2. FIG. 3B is a Smith chart representing an impedance change on the signal path from the common terminal P1 to the input/output terminal P2. The reason why the equivalent circuit of the switch module 100 is represented by that shown in FIG. 3A is as follows.

A switch including a FET that is turned OFF stores some electric charge and can thus be regarded as a capacitor. The impedance of a switch including a FET that is turned OFF is capacitive, as in a capacitor. A switch including a FET that is turned ON can be regarded as a very small resistor.

By taking these points into account, the first and fourth switches SW1 and SW4 that are turned OFF in FIG. 2 are represented as capacitors in FIG. 3A. The second and sixth switches SW2 and SW6 that are turned ON in FIG. 2 are represented as resistors in FIG. 3A.

SAW filters include interdigital transducer (IDT) electrodes. The comb teeth of the IDT electrodes serve as capacitor electrodes, and thus, the characteristic impedance of the SAW filters for a signal in the stop band is capacitive. The characteristic impedance of the SAW filters for a signal in the pass band is set to be about 50Ω, for example.

Figure 3B:
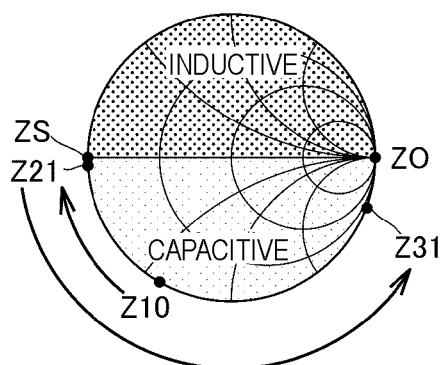
FIG. 3B is a Smith chart representing an impedance change on a signal path from a common terminal to an input/output terminal in the switch module shown in FIG. 2.
Figure 4A:
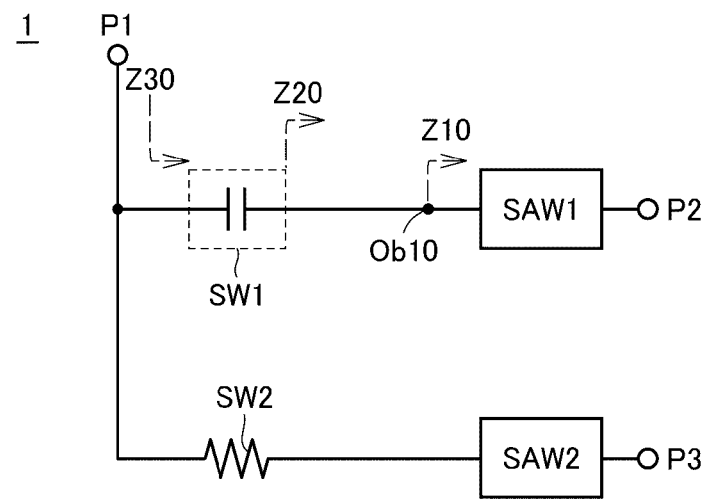
FIG. 4A is an equivalent circuit diagram of the switch module according to the first embodiment shown in FIG. 1.
Figure 4B:
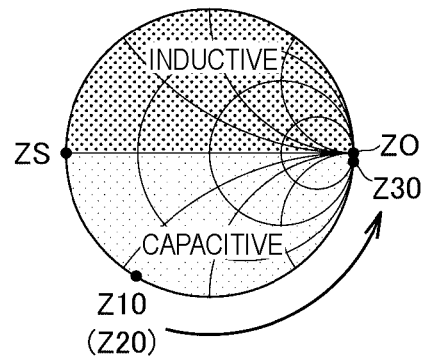
FIG. 4B is a Smith chart representing an impedance change on a signal path from a common terminal to an input/output terminal in the switch module shown in FIG. 1.

In FIG. 3B, a point ZO is a point at which impedance is infinite (open), while a point ZS is a point at which impedance is 0 (short). As shown in FIG. 3B, impedance Z10 of the first filter SAW1 seen from an observation point Ob10 which connects the third node C3 and the first filter SAW1 is represented by the impedance of the first filter SAW1 for a signal in the stop band and is thus capacitive. Impedance Z21 of the first filter SAW1 seen from the end portion of the first switch SW1 connected to the first filter SAW1 is in the short state, which is close to the point ZS, because of the provision of the sixth switch SW6 that connects the third node C3 and a ground point. Impedance Z31 of the first filter SAW1 seen from the common terminal P1 is not influenced by the impedance Z10 of the first filter SAW1 because the impedance Z21 is in the short state. That is, the impedance Z31 is represented by the impedance of the first switch SW1 that is turned OFF and is thus capacitive. The impedance Z31 is closer to be infinite (open state) and is thus less likely to see the impedance of the input/output terminal P2.

The impedance of the switch module 1 of the first embodiment will now be explained below. FIG. 4A is an equivalent circuit diagram of the switch module 1 shown in FIG. 1. FIG. 4B is a Smith chart representing an impedance change on the signal path from the common terminal P1 to the input/output terminal P2. As shown in FIG. 4B, impedance Z10 of the first filter SAW1 seen from the observation point Ob10 is similar to that in the first comparative example. Impedance Z20 of the first filter SAW1 seen from the end portion of the first switch SW1 connected to the first filter SAW1 is not made to be in the short state without the provision of a shunt-connected switch, and thus, the capacitive impedance Z10 is maintained. Impedance Z30 of the first filter SAW1 seen from the common terminal P1 is represented by the combined impedance of the capacitive impedance Z10 of the first filter SAW1 for a signal in the stop band and the capacitive impedance of the first switch SW1 that is turned OFF. The impedance Z30 is thus closer to the point ZO than the impedance Z31 in the first comparative example and is in the open state. When the impedance Z30 is in the open state, the common terminal P1 and the input/output terminal P2 are regarded as being disconnected from each other.

In the switch module 1 of the first embodiment, without a shunt-connected switch that connects a signal path and a ground point, impedance is not made to be in the short state in a range between the common terminal P1 and the input/output terminal P2. Instead, the impedance of the input/output terminal P2 seen from the common terminal P1 is represented by the combined impedance of plural capacitive impedances, that is, the impedance of the first switch SW1 that is turned OFF and the impedance of the first filter SAW1 for a signal in the stop band. The impedance of the input/output terminal P2 seen from the common terminal P1 is thus closer to the point ZO than that in the first comparative example. In FIGS. 3A through 4B, a comparison is made between an impedance change of the input/output terminal P2 seen from the common terminal P1 in the first embodiment and that in the first comparative example. Similarly, regarding an impedance change of the common terminal P1 seen from the input/output terminal P2, the impedance of the common terminal P1 seen from the input/output terminal P2 in the first embodiment is also closer to the point ZO than that in the first comparative example.

A second comparative example in which the impedance of a filter is inductive (the imaginary part of the impedance is positive) will now be discussed below with reference to FIGS. 5B through 6B. Then, the results of comparison between the insertion loss of the first embodiment and that of the first and second comparative examples will be discussed with reference to FIG. 7. The second comparative example differs from the first embodiment in that the filter is inductive. The other points are similar to those of the first embodiment, and an explanation thereof will thus be omitted.

FIG. 5A is a Smith chart representing simulation results of an impedance change of a SAW filter in the first embodiment. FIG. 5B is a Smith chart representing simulation results of an impedance change of a filter in the second comparative example. In FIG. 5A, a curve S1 indicates an impedance change. The curve S1 included in a region PB indicates the impedance for a signal in the pass band, while the curve S1 included in a region NPB1 indicates the impedance for a signal in the stop band. The curve S1 which is neither included in the region PB nor the region NPB1 indicates the impedance of a signal in the transition band. As shown in FIG. 5A, the impedance of the SAW filter for a signal in the stop band in the first embodiment changes within the region NPB1 where the imaginary part of the impedance is negative. That is, the impedance is capacitive.

As shown in FIG. 5B, the impedance of the filter for a signal in the stop band in the second comparative example changes within a region NPB2 where the imaginary part of the impedance is positive. That is, the impedance is inductive.

Figure 6A:
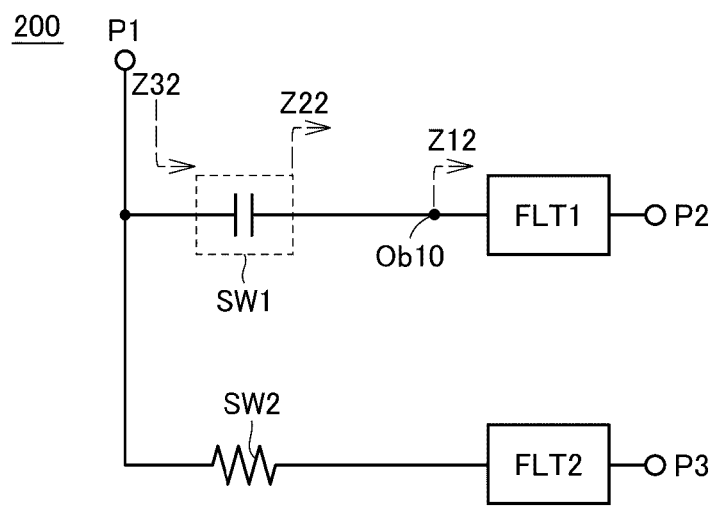
FIG. 6A is an equivalent circuit diagram of a switch module according to the second comparative example.
Figure 6B:
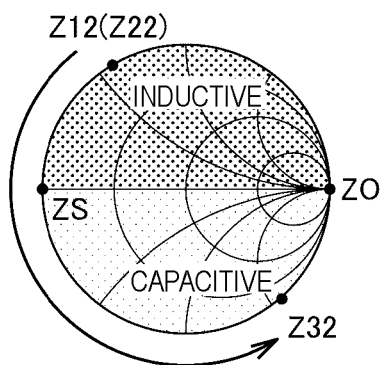
FIG. 6B is a Smith chart representing an impedance change on a signal path from a common terminal to an input/output terminal in the switch module of the second comparative example.

FIG. 6A is an equivalent circuit diagram of a switch module 200 of the second comparative example. FIG. 6B is a Smith chart representing an impedance change on the signal path from the common terminal P1 to the input/output terminal P2 in the switch module 200. The second comparative example differs from the first embodiment in that the impedance of a filter for a signal in the stop band is inductive. The other points are similar to those of the first embodiment, and an explanation thereof will thus be omitted.

As shown in FIG. 6A, the switch module 200 includes first and second filters FLT1 and FLT2. The impedance of the first filter FLT1 for a signal in the stop band is inductive. The impedance of the second filter FLT2 for a signal in the stop band is also inductive.

As shown in FIG. 6B, impedance Z12 of the first filter FLT1 seen from the observation point Ob10 is represented by the impedance of the first filter FLT1 for a signal in the stop band and is thus inductive. Impedance Z22 of the first filter FLT1 seen from the end portion of the first switch SW1 connected to the first filter FLT1 is not made to be in the short state without the provision of a shunt-connected switch, and thus, the inductive impedance Z12 is maintained. Impedance Z32 of the first filter FLT1 seen from the common terminal P1 is represented by the combined impedance of the inductive impedance Z12 of the first filter FLT1 for a signal in the stop band and the capacitive impedance of the first switch SW1 that is turned OFF.

Combining of the capacitive impedance of the first switch SW1 that is turned OFF into the inductive impedance Z12 of the first filter FLT1 causes the impedance Z12 moves to the point ZS and approaches the point ZO on the Smith chart. In the first comparative example, the capacitive impedance of the first switch SW1 that is turned OFF is combined into the impedance in the short state close to the point ZS, thereby causing the combined impedance to approach the point ZO. In the first embodiment, the capacitive impedance of the first switch SW1 that is turned OFF is combined into the capacitive impedance of the first filter SAW1 for a signal in the stop band, thereby causing the combined impedance to approach the point ZO. The combined impedance in the second comparative example does not approach the point ZO as close as that in the first comparative example and in the first embodiment. As a result, a greater insertion loss incurs in the second comparative example than that in the first comparative example and the first embodiment.

FIG. 7 is a graph representing the insertion loss of the switch module 1 of the first embodiment and that of the switch modules 100 and 200 of the first and second comparative examples. In FIG. 7, the stop band of the first filter SAW1 shown in FIG. 1 and the pass band of the second filter SAW2 shown in FIG. 1 are both within a range of about 925 to 960 MHz. A curve E1 represents the insertion loss of the switch module 1 of the first embodiment, and curves E10 and E20 respectively represent the insertion loss of the switch modules 100 and 200 of the first and second comparative examples. In FIG. 7, the insertion loss is represented by a negative value, and as the absolute value of the insertion loss is greater, a decrease in a signal from the input terminal to the output terminal is greater. The magnitude of the absolute value represents the magnitude of the insertion loss. That is, in FIG. 7, a curve is positioned above the other curves means that the absolute value of this curve is smaller than the absolute values of the other curves, and thus, the insertion loss represented by this curve is smaller than that by the other curves.

As shown in FIG. 7, in the frequency range of about 925 to 960 MHz, the insertion loss of the switch module 1 of the first embodiment is smaller than that of the switch modules 100 and 200 of the first and second comparative examples.

In the switch module 1 of the first embodiment, without a shunt-connected switch, impedance on a signal path from the common terminal P1 to an input/output terminal via an associated switch that is turned OFF is not in the short state, but is in the open state due to the combined capacitive impedance. As a result, it is possible to reduce the insertion loss of the switch module 1.

First Modified Example of First Embodiment

In the first embodiment, the pass band of the first filter SAW1 does not overlap that of the second filter SAW2, and thus, the switch module 1 does not include shunt-connected switches. However, if the pass band of one filter overlaps that of another filter in a switch module, the provision of shunt-connected switches is necessary. In a first modified example of the first embodiment, the provision of shunt-connected switches is necessary because the pass band of one filter overlaps that of another filter. In the first modified example, the configurations of elements designated by like reference numerals of the first embodiment are similar to those of the first embodiment, and an explanation thereof will thus be omitted.

Figure 8:
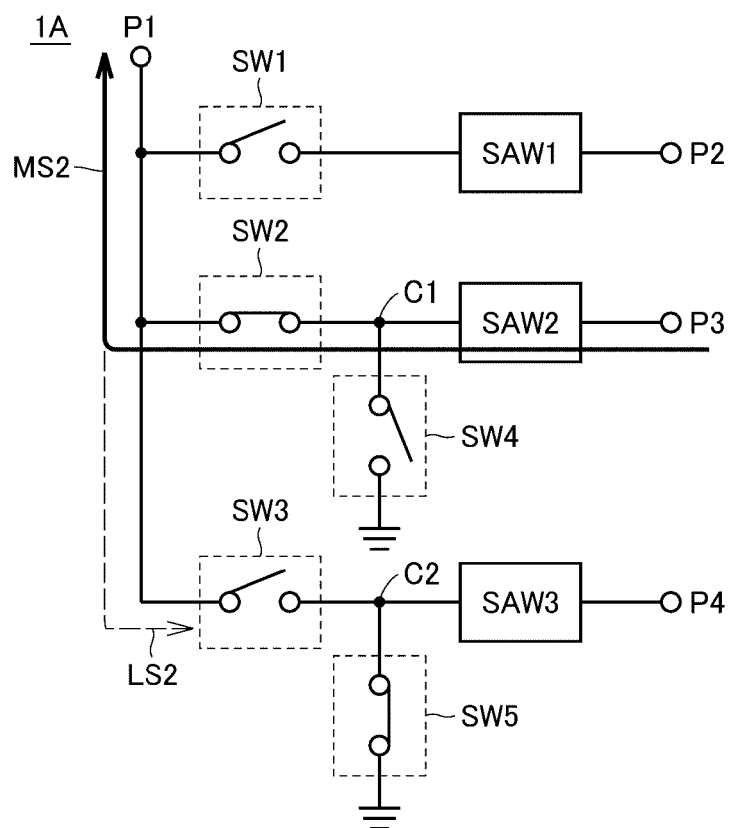
FIG. 8 is a circuit diagram of a switch module according to a first modified example of the first embodiment.

FIG. 8 is a circuit diagram of a switch module 1A according to the first modified example of the first embodiment. The switch module 1A includes an input/output terminal P4, a third switch SW3, a third filter SAW3, which is a SAW filter, and fourth and fifth switches SW4 and SW5, which are shunt-connected switches. The switch module 1A is a SP3T switch module. Alternatively, the switch module 1A may be a SPnT (n is four or greater) switch module.

The pass band of the third filter SAW3 corresponds to a fourth frequency band of an embodiment of the disclosure. The pass band of the second filter SAW2 and that of the third filter SAW3 overlap each other. The pass band of the first filter SAW1 and that of the third filter SAW3 do not overlap each other.

On a path from the common terminal P1 to the input/output terminal P4, the third switch SW3 and the third filter SAW3 are connected in this order. The third switch SW3 switches between electrical connection and disconnection between the common terminal P1 and the third filter SAW3.

The fourth switch SW4 switches between electrical connection and disconnection between a ground point and a first node C1 between the second switch SW2 and the second filter SAW2. When the second switch SW2 is turned OFF, the fourth switch SW4 is turned ON for a signal included in both of the pass band of the second filter SAW2 and that of the third filter SAW3.

The fifth switch SW5 switches between electrical connection and disconnection between a ground point and a second node C2 between the third switch SW3 and the third filter SAW3. When the third switch SW3 is turned OFF, the fifth switch SW5 is turned ON for a signal included in both of the pass band of the second filter SAW2 and that of the third filter SAW3.

In FIG. 8, the first switch SW1 is OFF; the second switch SW2 is ON and the fourth switch SW4 is OFF; and the third switch SW3 is OFF and the fifth switch SW5 is ON. The ON/OFF states of the first through fifth switches SW1 through SW5 are set in this manner when, for example, a signal MS2 included in both of the pass band of the second filter SAW2 and that of the third filter SAW3 is input from the input/output terminal P3 and is transmitted from the antenna connected to the common terminal P1.

A signal LS2 may leak from the signal MS2 and be input into the signal path to the input/output terminal P4. The signal LS2, which is a signal in the pass band of the third filter SAW3, may reach and pass through the third filter SAW3 and be output from the input/output terminal P4.

In the first modified example of the first embodiment, the signal LS2 is mostly shunted before reaching the third filter SAW3 because of the ON state of the fifth switch SW5, which is a shunt-connected switch, and is not influenced by the impedance of the third filter SAW3. Consequently, the signal LS2 which leaks from the signal MS2 is unlikely to be output from the input/output terminal P4. In the switch module 1A, the isolation characteristics can be maintained even for a signal included in the pass bands of plural filters.

In the first modified example of the first embodiment, it is possible to reduce the insertion loss of the switch module 1A and also to maintain isolation characteristics even for a signal included in the pass bands of plural filters.

Second Modified Example of First Embodiment

In the first embodiment and the first modified example thereof, the switch modules 1 and 1A include the common terminal P1 and plural input/output terminals connected to individual SAW filters. The single common terminal P1 is used for all plural input/output terminals. In a second modified example of the first embodiment, a switch module includes two common terminals. The configuration between each SAW filter and the common terminal P1 in the second modified example is similar to that of the first modified example of the first embodiment, and an explanation thereof will thus be omitted.

Figure 9:
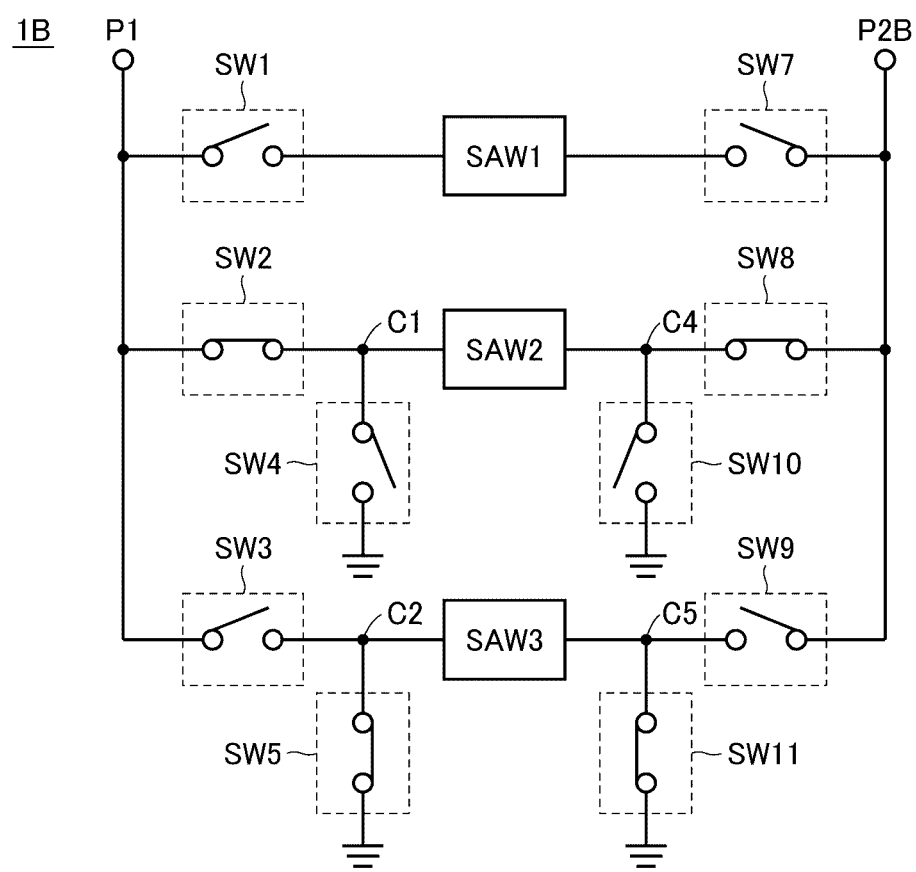
FIG. 9 is a circuit diagram of a switch module according to a second modified example of the first embodiment.

FIG. 9 is a circuit diagram of a switch module 1B according to the second modified example of the first embodiment. As shown in FIG. 9, the switch module 1B includes a common terminal P2B (second terminal), seventh, eighth, and ninth switches SW7, SW8, and SW9, and tenth and eleventh switches SW10 and SW11. The tenth and eleventh switches SW10 and SW11 are shunt-connected switches.

The seventh switch SW7 switches between electrical connection and disconnection between the common terminal P2B and the first filter SW1. The eighth switch SW8 switches between electrical connection and disconnection between the common terminal P2B and the second filter SW2. The ninth switch SW9 switches between electrical connection and disconnection between the common terminal P2B and the third filter SW3. The first filter SW1 is connected between the first and seventh switches SW1 and SW7. The second filter SW2 is connected between the second and eighth switches SW2 and SW8. The third filter SW3 is connected between the third and ninth switches SW3 and SW9.

When the seventh switch SW7 is turned OFF, the impedance of the seventh switch SW7 is capacitive. The impedance of the first filter SAW1 seen from the end portion of the seventh switch SW7 connected to the first filter SAW1 is not in the short state, and the impedance of the first filter SAW1 seen from the common terminal P2B is in the open state.

The tenth switch SW10 switches between electrical connection and disconnection between a ground point and a fourth node C4 between the eighth switch SW8 and the second filter SAW2. When the eighth switch SW8 is turned OFF, the tenth switch SW10 is turned ON for a signal included in both of the pass band of the second filter SAW2 and that of the third filter SAW3.

The eleventh switch SW11 switches between electrical connection and disconnection between a ground point and a fifth node C5 between the ninth switch SW9 and the third filter SAW3. When the ninth switch SW9 is turned OFF, the eleventh switch SW11 is turned ON for a signal included in both of the pass band of the second filter SAW2 and that of the third filter SAW3.

In the second modified example of the first embodiment, it is possible to reduce the insertion loss of the switch module 1B.

Second Embodiment

In the first embodiment, without the provision of a shunt-connected switch, a connection path from a series-connected switch to a SAW filter is not connected to a ground point so that the impedance from the common terminal P1 to each input/output terminal can be made to be in the open state. However, other measures may be taken to make the impedance from the common terminal P1 to each input/output terminal be in the open state. Any measures may be taken not to connect a connection path from a series-connected switch to a SAW filter to a ground point. In a second embodiment, shunt-connected switches are provided, and regardless of whether series-connected switches are ON or OFF, the shunt-connected switches are turned OFF, so that a connection path from a series-connected switch to a SAW filter is not connected to a ground point. In the second embodiment, the configurations of elements designated by like reference numerals of the first embodiment are similar to those of the first embodiment, and an explanation thereof will thus be omitted.

Figure 10:
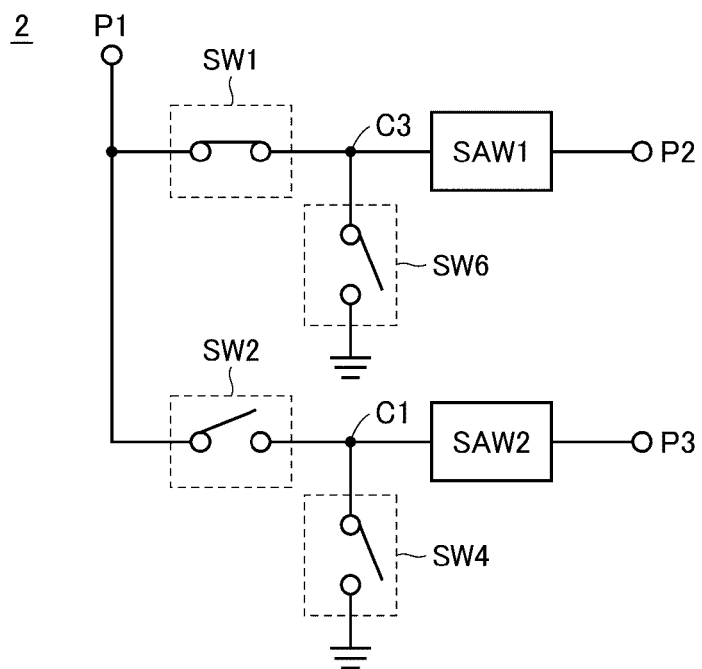
FIG. 10 is a circuit diagram of a switch module according to a second embodiment.

FIG. 10 is a circuit diagram of a switch module 2 according to the second embodiment. As shown in FIG. 10, the switch module 2 includes fourth and sixth switches SW4 and SW6 as shunt-connected switches.

The fourth switch SW4 switches between electrical connection and disconnection between a ground point and a first node C1 between the second switch SW2 and the second filter SAW2. The fourth switch SW4 is turned OFF regardless of whether the second switch SW2 is ON or OFF.

The sixth switch SW6 switches between electrical connection and disconnection between a ground point and a third node C3 between the first switch SW1 and the first filter SAW1. The sixth switch SW6 is turned OFF regardless of whether the first switch SW1 is ON or OFF.

In the switch module 2 of the second embodiment, the shunt-connected switches are turned OFF regardless of the first and second switches are ON or OFF, so that the impedance of the first filter SAW1 seen from the end portion of the first switch SW1 connected to the first filter SAW1 will not be made to be in the short state. With this configuration, the impedance on a signal path from the common terminal P1 to an input/output terminal via an associated switch that is turned OFF is not in the short state, but is in the open state. As a result, it is possible to reduce the insertion loss of the switch module 2, as in the switch module 1 of the first embodiment.

First Modified Example of Second Embodiment

Figure 11:
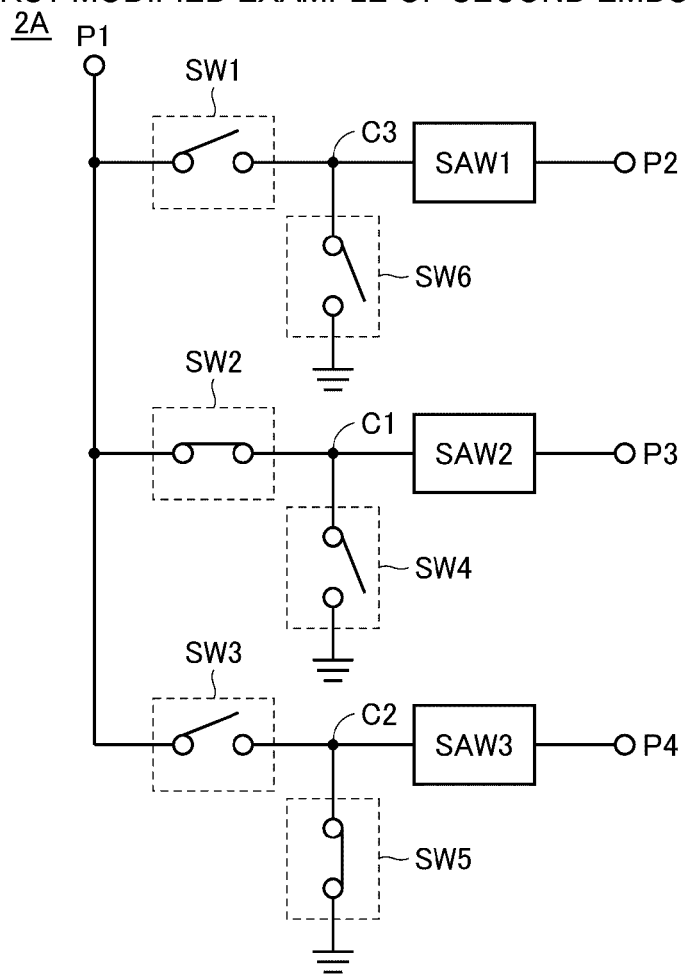
FIG. 11 is a circuit diagram of a switch module according to a first modified example of the second embodiment.

In a first modified example of the second embodiment, a switch module 2A (FIG. 11) includes a shunt-connected switch because the pass bands of two filters in the switch module 2A overlap each other, as in the first modified example of the first embodiment. The first modified example of the second embodiment differs from the first modified example of the first embodiment in that the sixth switch SW6 discussed in the second embodiment is connected between a ground point and the third node C3 between the first switch SW1 and the first filter SAW1. The configurations of the other elements are similar to those of the first modified example of the first embodiment, and an explanation thereof will thus be omitted.

In the first modified example of the second embodiment, it is possible to reduce the insertion loss of the switch module 2A, as in the first modified example of the first embodiment.

Second Modified Example of Second Embodiment

In a second modified example of the second embodiment, a switch module 2B (FIG. 12) includes two common terminals, as in the second modified example of the first embodiment. The second modified example of the second embodiment differs from the second modified example of the first embodiment in that a sixth switch SW6 is connected between a ground point and a third node C3 between the first switch SW1 and the first filter SAW1 and that a twelfth switch SW12 is connected between a ground point and a sixth node C6 between the seventh switch SW7 and the first filter SAW1. The configurations of the other elements are similar to those of the second modified example of the first embodiment, and an explanation thereof will thus be omitted. The sixth switch SW6 is similar to that of the second embodiment, and an explanation thereof will thus be omitted.

Figure 12:
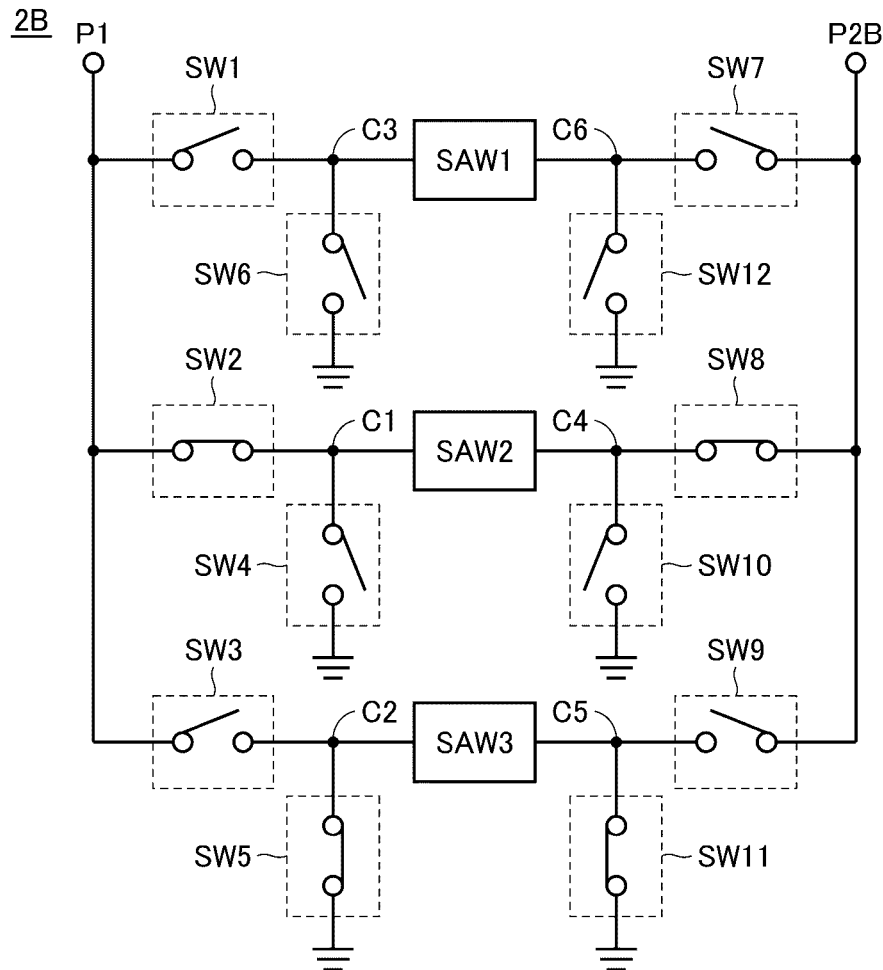
FIG. 12 is a circuit diagram of a switch module according to a second modified example of the second embodiment.

As shown in FIG. 12, the switch module 2B includes the twelfth switch SW12. The twelfth switch SW12 switches between electrical connection and disconnection between a ground point and the sixth node C6 between the seventh switch SW7 and the first filter SAW1. The twelfth switch SW12 is turned OFF regardless of whether the seventh switch SW7 is ON or OFF. The impedance of the first filter SAW1 seen from the end portion of the seventh switch SW7 connected to the first filter SAW1 is not in the short state, and the impedance of the first filter SAW1 seen from the common terminal P2B is in the open state.

In the second modified example of the second embodiment, it is possible to reduce the insertion loss of the switch module 2B, as in the second modified example of the first embodiment.

Third Embodiment

In the first and second embodiments, SPDT and SP3T switch modules are used as examples of a SPnT switch module according to an embodiment of the disclosure.

However, the disclosure may be applicable to other types of SPnT switch modules. In a third embodiment, a SP6T switch module is used as an example of the SPnT switch module.

Figure 13:
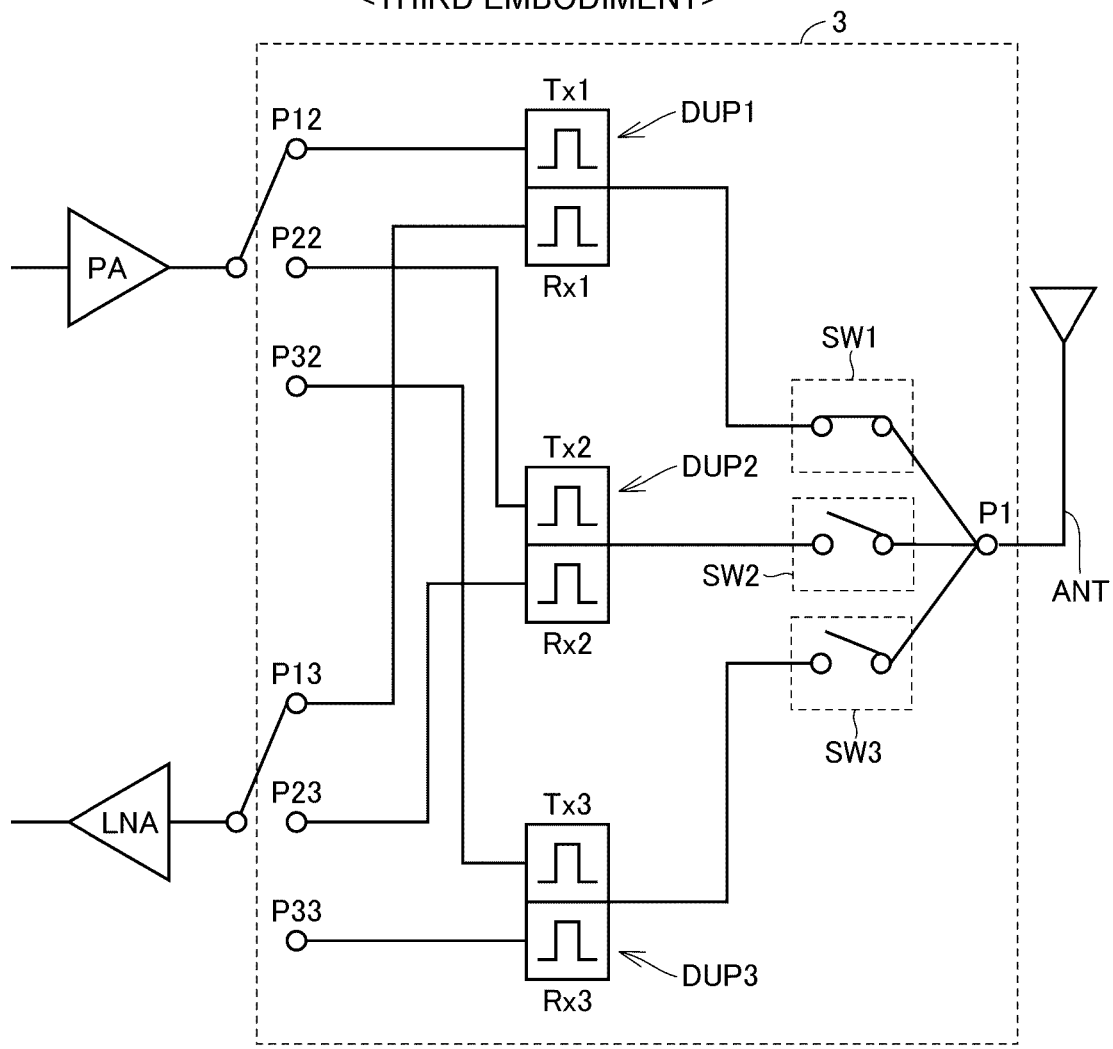
FIG. 13 is a circuit diagram of a switch module according to a third embodiment.
Figure 14:
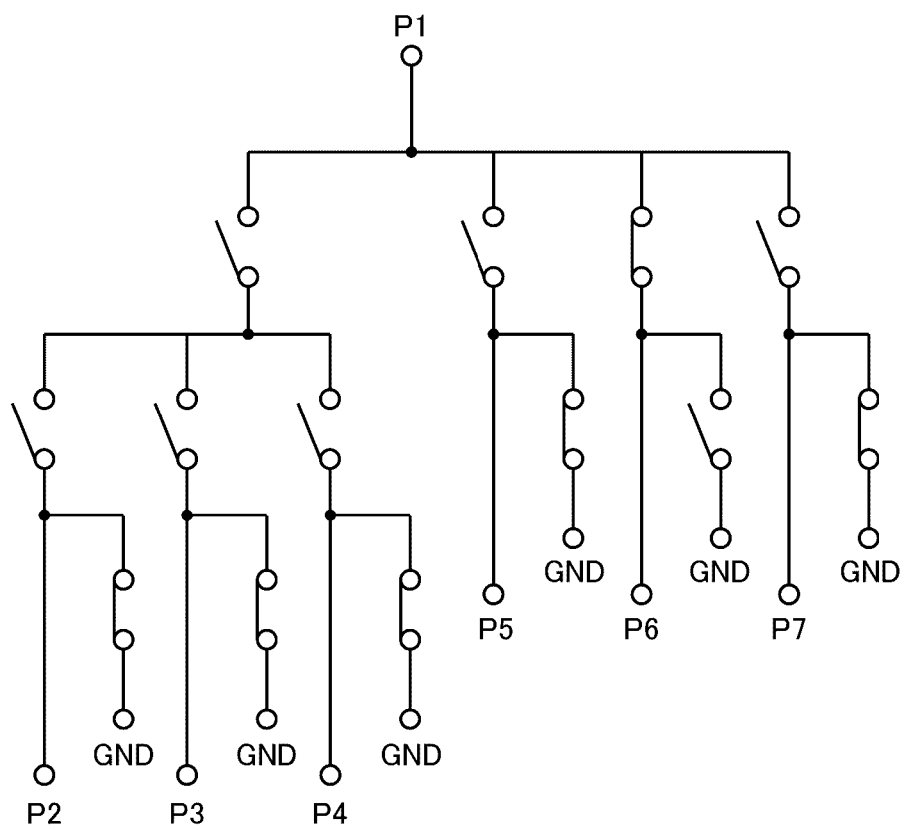
FIG. 14 is a circuit diagram shown in FIG. 13 of Japanese Unexamined Patent Application Publication No. 2014-93610.

FIG. 13 is a circuit diagram of a switch module 3 according to the third embodiment. As shown in FIG. 13, the switch module 3 includes a common terminal P1, first, second, and third switches SW1, SW2, and SW3, input/output terminals P12, P13, P22, P23, P32, and P33, and duplexers DUP1, DUP2, and DUP3.

The first switch SW1 switches between electrical connection and disconnection between the duplexer DUP1 and the common terminal P1. The second switch SW2 switches between electrical connection and disconnection between the duplexer DUP2 and the common terminal P1. The third switch SW3 switches between electrical connection and disconnection between the duplexer DUP3 and the common terminal P1.

The duplexer DUP1 includes a transmit circuit Tx1 and a receive circuit Rx1. The transmit circuit Tx1 is connected between the common terminal P1 and the input/output terminal P12. The transmit circuit Tx1 includes a SAW filter (not shown). The receive circuit Rx1 is connected between the common terminal P1 and the input/output terminal P13. The receive circuit Rx1 includes a SAW filter (not shown).

The duplexer DUP2 includes a transmit circuit Tx2 and a receive circuit Rx2. The transmit circuit Tx2 is connected between the common terminal P1 and the input/output terminal P22. The transmit circuit Tx2 includes a SAW filter (not shown). The receive circuit Rx2 is connected between the common terminal P1 and the input/output terminal P23. The receive circuit Rx2 includes a SAW filter (not shown).

The duplexer DUP3 includes a transmit circuit Tx3 and a receive circuit Rx3. The transmit circuit Tx3 is connected between the common terminal P1 and the input/output terminal P32. The transmit circuit Tx3 includes a SAW filter (not shown). The receive circuit Rx3 is connected between the common terminal P1 and the input/output terminal P33. The receive circuit Rx3 includes a SAW filter (not shown).

The common terminal P1, the input/output terminals P12, P22, and P32, the first, second, and third switches SW1, SW2, and SW3, and the transmit circuits Tx1, Tx2, and Tx3 form a SP3T switch module according to an embodiment of the disclosure.

The common terminal P1, the input/output terminals P13, P23, and P33, the first, second, and third switches SW1, SW2, and SW3, and the receive circuits Rx1, Rx2, and Rx3 form a SP3T switch module according to an embodiment of the disclosure.

The switch module 3 includes two SP3T switch modules according to an embodiment.

In the third embodiment, an antenna ANT is connected to the common terminal P1. A power amplifier (PA) is connected to the input/output terminals P12, P22, and P32. A low noise amplifier (LNA) is connected to the input/output terminals P13, P23, and P33. The circuit diagram shown in FIG. 13 may be used for a transmit-and-receive circuit of a mobile terminal, such as a smartphone.

Instead of the duplexers DUP1 through DUP3, triplexers may be used. In this case, a switch module according to the third embodiment includes three SP3T switch modules and serves as a SP9T switch module.

In the third embodiment, it is possible to reduce the insertion loss of the switch module 3, as in the first and second embodiments.

Fourth Embodiment

In a fourth embodiment, as well as in the first embodiment, a shunt-connected switch is not provided between a switch and a filter. In the fourth embodiment, however, a phase shift line is disposed on a path connecting a switch and a filter.

Figure 15:
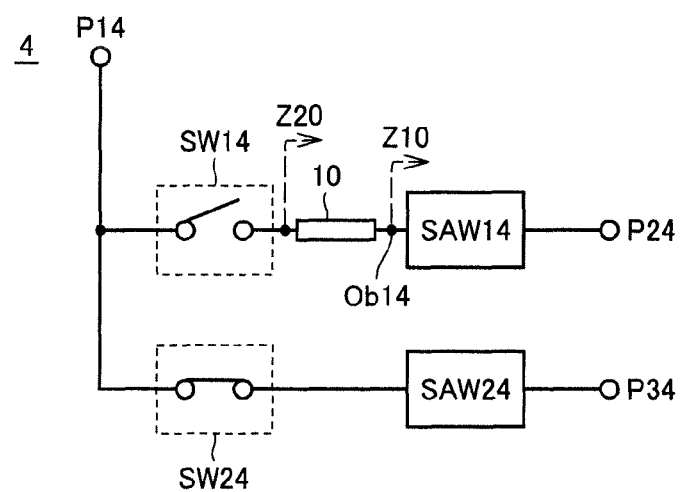
FIG. 15 is a circuit diagram of a switch module according to a fourth embodiment.

FIG. 15 is a circuit diagram of a switch module 4 according to the fourth embodiment. As shown in FIG. 15, the switch module 4 includes a common terminal P14 (first terminal), input/output terminals P24 and P34, a first switch SW14, a second switch SW24, a first filter SAW14, a second filter SAW24, and a phase shift line 10 (first phase shift line). The first and second filters SAW14 and SAW24 are SAW filters.

The first and second switches SW14 and SW24 are connected to the common terminal P14. The first filter SAW14 is connected to the input/output terminal P24, and the phase shift line 10 is connected between the first switch SW14 and the first filter SAW14. The second filter SAW24 is connected between the input/output terminal P34 and the second switch SW24. No shunt-connected switch is disposed on a path (first path) connecting the first switch SW14 and the first filter SAW14 or on a path (second path) connecting the second switch SW24 and the second filter SAW24.

In the fourth embodiment, the pass band of the first filter SAW14 is set to be a first frequency band, while the pass band of the second filter SAW24 is set to be a second frequency band. The pass band of the first filter SAW14 and that of the second filter SAW24 do not overlap each other.

The ON/OFF states of the first and second switches SW14 and SW24 are controlled by a controller (not shown). To transmit a signal in the pass band of the first filter SAW14 between the common terminal P14 and the input/output terminal P24, the first switch SW14 is turned ON and the second switch SW24 is turned OFF. To transmit a signal in the pass band of the second filter SAW24 between the common terminal P14 and the input/output terminal P34, the first switch SW14 is turned OFF and the second switch SW24 is turned ON.

Figure 16:
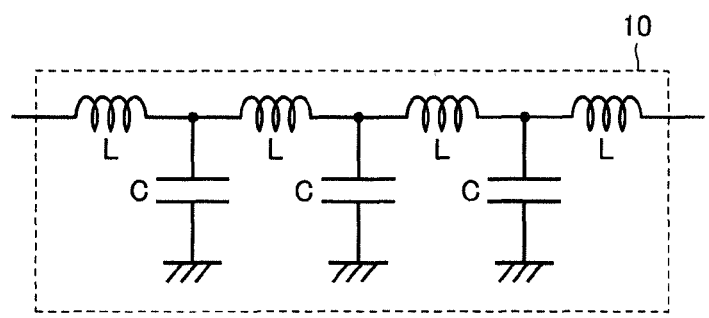
FIG. 16 is an equivalent circuit diagram of a phase shift line shown in FIG. 15.

Typically, the phase shift line 10 is a line that connects the first switch SW14 and the first filter SAW14. In this case, "line" means a conductive path including, but not limited to, a wiring pattern formed in or on a substrate which forms a filter, an interlayer connecting via-hole, a bump for connecting to an external device, or the like. As shown in the equivalent circuit diagram of FIG. 16, the phase shift line 10 can be represented by a combination of series-connected inductors L and capacitors C, each capacitor C being connected between ground and a node between the corresponding inductors L. That is, the impedance of the phase shift line 10 is determined by the inductance components of the inductors L and the capacitance components of the capacitors C.

Figure 17:
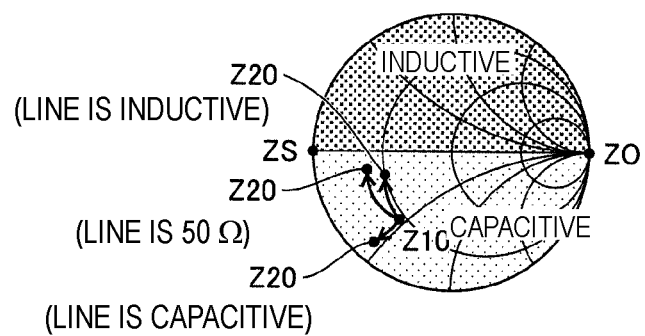
FIG. 17 is a figure representing an impedance change on a signal path caused by an impedance of the phase shift line shown in FIG. 15.

It is now assumed that the impedance of the first filter SAW14 as seen from a node between the phase shift line 10 and the first filter SAW14 (observation point Ob14) is Z10. In this case, impedance Z20 of the first filter SAW14 as seen from a node (first node) between the first switch SW14 and the phase shift line 10 changes in accordance with the characteristics of impedance (capacitive, inductive, or characteristic impedance) of the phase shift line 10, as shown in FIG. 17. For example, the impedance of the phase shift line 10 varies depending on the thickness of the phase shift line 10 and the distance between the phase shift line 10 and a ground electrode. As the phase shift line 10 becomes thinner, the impedance becomes more inductive, and as the phase shift line 10 becomes thicker, the impedance becomes relatively more capacitive. As the distance between the phase shift line 10 and a ground electrode increases, the impedance becomes more inductive, and as the distance between the phase shift line 10 and the ground electrode decreases, the impedance becomes relatively more capacitive.

The first filter SAW14 is a SAW filter, and the impedance of the first filter SAW14 for a signal in the second frequency band is capacitive. The phase shift line 10 has an electrical length which causes reactance to become negative on a Smith chart.

Without a shunt-connected switch in the switch module 4, the impedance Z20 of the first filter SAW14 as seen from the first node between the first switch SW14 and the phase shift line 10 is not shorted, but becomes capacitive. Hence, the impedance of the first filter SAW14 as seen from the common terminal P14 becomes higher than that when the first node is connected to ground. With this configuration, when the first switch SW14 is OFF, a signal in the pass band of the second filter SAW24 can be prevented from leaking to the first filter SAW14.

As described above, in the switch module 4 of the fourth embodiment, the phase shift line 10 is disposed in a signal path. With this configuration, even without a shunt-connected switch, it is possible to prevent a leakage of a signal from a terminal connected to another signal path, thereby reducing the insertion loss.

Regarding the signal path connected to the second filter SAW24, if the pass band of the first filter SAW14 and that of the second filter SAW24 do not overlap each other and if a line between the second switch SW24 and the second filter SAW24 has characteristics similar to those of the phase shift line 10, the provision of a shunt-connected switch in the signal path may be omitted. However, if the pass band of the first filter SAW14 and that of the second filter SAW24 overlap each other, a shunt-connected switch may be provided on the signal path connected to the second filter SAW24, as in the first modified example (FIG. 8) of the first embodiment.

Modified Example of Fourth Embodiment

In a modified example of the fourth embodiment, a switch module having two common terminals will be discussed, as in the second modified example of the first embodiment and the second modified example of the second embodiment.

Figure 18:
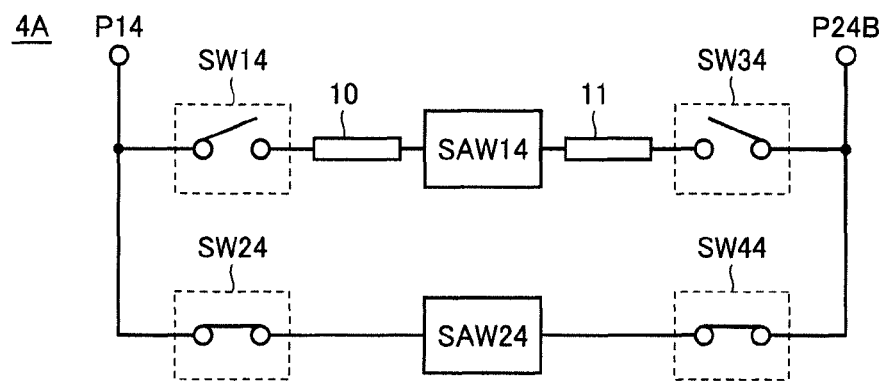
FIG. 18 is a circuit diagram of a switch module according to a first modified example of the fourth embodiment.

FIG. 18 is a circuit diagram of a switch module 4A according to the modified example of the fourth embodiment. As shown in FIG. 18, the switch module 4A includes a common terminal P24B (second terminal), a third switch SW34, a fourth switch SW44, and a phase shift line 11 (second phase shift line), in addition to the elements of the switch module 4 shown in FIG. 15.

The third and fourth switches SW34 and SW44 are connected to the common terminal P24B. The phase shift line 11 is connected between the third switch SW34 and the first filter SAW14. The fourth switch SW44 is connected between the common terminal P24B and the second filter SAW24. No shunt-connected switch is disposed on a path (third path) connecting the third switch SW34 and the first filter SAW14 or on a path (fourth path) connecting the fourth switch SW44 and the second filter SAW24.

The third switch SW34 and the first switch SW14 are turned ON together or OFF together. When the first switch SW14 is ON, the third switch SW34 is also ON. When the first switch SW14 is OFF, the third switch SW34 is also OFF. Likewise, the fourth switch SW44 and the second switch SW24 are turned ON together or OFF together.

When the third switch SW34 is OFF, the impedance of the third switch SW34 is capacitive. The impedance of the first filter SAW14 as seen from a node (second node) between the third switch SW34 and the phase shift line 11 is not shorted. Hence, the impedance of the first filter SAW14 as seen from the common terminal P24B becomes higher than that when the second node is connected to ground.

In the modified example of the fourth embodiment, it is possible to reduce the insertion loss of the switch module 4A.

Fifth Embodiment

In the second embodiment and the modified examples thereof, a shunt-connected switch is provided on each connection path between a switch and a SAW filter, and regardless of whether a switch between the common terminal and the corresponding SAW filter is ON or OFF, the shunt-connected switch is OFF.

In a switch module of a fifth embodiment, a shunt-connected switch is disposed on each path connecting a switch and a SAW filter, and the ON/OFF state of each shunt-connected switch is controlled according to a predetermined condition.

Figure 19:
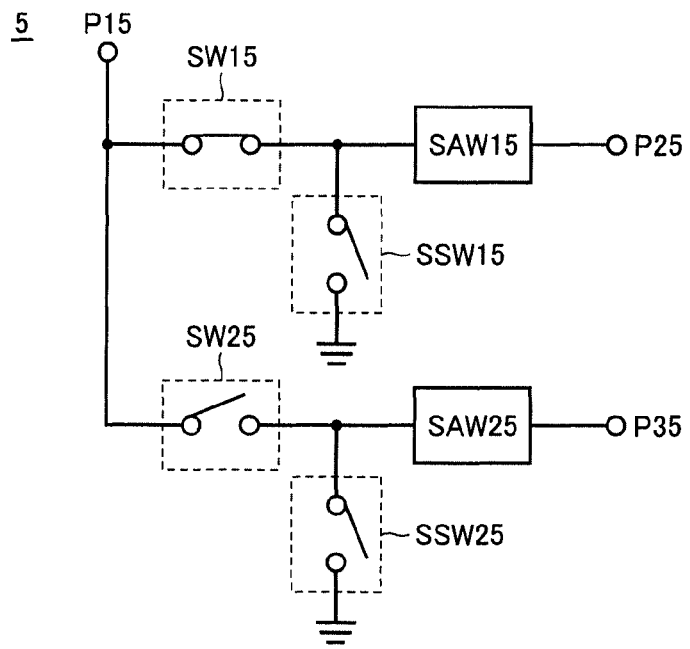
FIG. 19 is a circuit diagram of a switch module according to a fifth embodiment.

FIG. 19 is a circuit diagram of a switch module 5 according to the fifth embodiment. As shown in FIG. 19, the switch module 5 includes a common terminal P15 (first terminal), input/output terminals P25 and P35, a first switch SW15, a second switch SW25, a first filter SAW15, a second filter SAW25, a first shunt switch SSW15, and a second shunt switch SSW25. The first and second filters SAW15 and SAW25 are SAW filters.

The first and second switches SW15 and SW25 are connected to the common terminal P15. The first filter SAW15 is connected between the input/output terminal P25 and the first switch SW15. The second filter SAW25 is connected between the input/output terminal P35 and the second switch SW25.

The first shunt switch SSW15 is connected between ground and a path (first path) connecting the first switch SW15 and the first filter SAW15. The first shunt switch SSW15 is controlled independently of the first switch SW15. The second shunt switch SSW25 is connected between ground and a path (second path) connecting the second switch SW25 and the second filter SAW25. The second shunt switch SSW25 is controlled independently of the second switch SW25.

In the fifth embodiment, the pass band of the first filter SAW15 is set to be the first frequency band, while the pass band of the second filter SAW25 is set to be the second frequency band.

The ON/OFF states of the first and second switches SW15 and SW25 and the first and second shunt switches SSW15 and SSW25 are controlled by a controller (not shown). To transmit a signal in the pass band of the first filter SAW15 between the common terminal P15 and the input/output terminal P25, the first switch SW15 is turned ON and the second switch SW25 is turned OFF. To transmit a signal in the pass band of the second filter SAW25 between the common terminal P15 and the input/output terminal P35, the first switch SW15 is turned OFF and the second switch SW25 is turned ON.

When the first switch SW15 is ON, the first shunt switch SSW15 is OFF. In this case, the second shunt switch SSW25 is turned ON or OFF depending on the pass band of the first filter SAW15 and that of the second filter SAW25. For example, if the pass band (first frequency band) of the first filter SAW15 and the pass band (second frequency band) of the second filter SAW25 do not overlap, the second shunt switch SSW25 is turned OFF. If part of the first frequency band overlaps the second frequency band, the second shunt switch SSW25 is turned ON.

When the pass band of the first filter SAW15 and that of the second filter SAW25 do not overlap, even if a signal to pass through the first filter SAW15 leaks to the path connected to the second filter SAW25, it does not pass through the second filter SAW25. Accordingly, the second shunt switch SSW25 remains OFF.

In contrast, if part of the pass band of the first filter SAW15 overlaps that of the second filter SAW25, a signal in the overlapping frequency band may pass through the second filter SAW25 and reach the input/output terminal P35. Hence, if the pass bands of the first and second filters SAW15 and SAW25 overlap each other, the second shunt switch SSW25 is turned ON, thereby preventing a signal which will pass through the first filter SAW15 from leaking to the second filter SAW25.

Likewise, to transmit a signal in the pass band of the second filter SAW25 between the common terminal P15 and the input/output terminal P35, if the pass bands of the first and second filters SAW15 and SAW25 partially overlap, the first shunt switch SSW15 is turned ON, and if the pass bands of the first and second filters SAW15 and SAW25 do not overlap, the first shunt switch SSW15 is turned OFF.

First Modified Example of Fifth Embodiment

In the fifth embodiment, to transmit a signal on one signal path, the ON/OFF state of a shunt switch connected to the other signal path is switched according to whether the pass bands of the two filters overlap each other.

In a first modified example of the fifth embodiment, the ON/OFF state of a shunt switch is switched according to whether impedance of a filter as seen from the common terminal is inductive or capacitive.

It is now assumed that, in the configuration of the switch module 5 shown in FIG. 19, a signal is transmitted between the common terminal P15 and the input/output terminal P25 by turning ON the first switch SW15. In this case, the second switch SW25 is OFF. Typically, impedance of an OFF switch can be regarded as capacitive. When the impedance of the second filter SAW25 as seen from the common terminal P15 is inductive, an LC filter is formed by the second switch SW25 and the second filter SAW25 connected in series with each other. It is thus possible that part of a signal in the first frequency band will pass through the path (second path) connected to the second filter SAW25. In this case, the second shunt switch SSW25 is turned ON to make the second path shorted, thereby reducing a leakage of a signal in the first frequency band to the second path.

In contrast, when the impedance of the second filter SAW25 as seen from the common terminal P15 is capacitive, the second switch SW25 and the second filter SAW25 can be regarded as a circuit of series-connected capacitors. In this case, impedance on the second path becomes higher by turning OFF the second shunt switch SSW25 rather than by turning ON the second shunt switch SSW25 to make the second path shorted. Accordingly, when the impedance of the second filter SAW25 is capacitive, the second shunt switch SSW25 is turned OFF to increase the impedance of the second path, thereby reducing a leakage of a signal in the first frequency band to the second path.

Figure 20A:
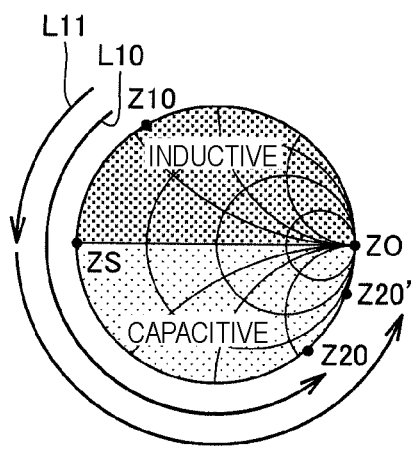
FIG. 20A is a Smith chart representing an impedance change on a signal path according to a first modified example of the fifth embodiment.
Figure 20B:
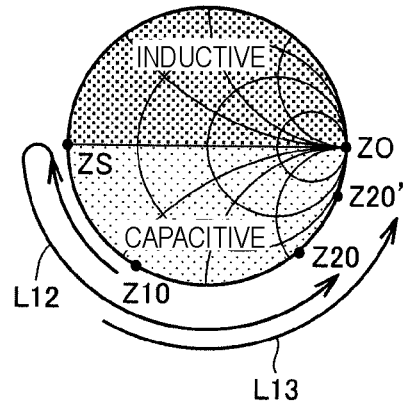
FIG. 20B is a Smith chart representing an impedance change on a signal path according to a first modified example of the fifth embodiment.

FIGS. 20A and 20B are Smith charts for explaining an impedance change on a signal path in the first modified example of the fifth embodiment. FIG. 20A illustrates an impedance change when the impedance of the second filter SAW25 as seen from the common terminal P15 is inductive. FIG. 20B illustrates an impedance change when the impedance of the second filter SAW25 as seen from the common terminal P15 is capacitive.

When the impedance Z10 of the second filter SAW25 as seen from the common terminal P15 is inductive (FIG. 20A), the impedance on the signal path is positioned in the upper half region on the Smith chart. When the second switch SW25 is OFF, the impedance of the second switch SW25 is capacitive, and thus, the impedance on the Smith chart moves counterclockwise and approaches the point ZO at which the impedance is infinite (open). In this case, the impedance moves in the upper half region and first approaches the point ZS at which the impedance is shorted, and then further moves counterclockwise in the lower half region and approaches the point ZO. The impedance on the signal path moves on the Smith chart in this manner. Accordingly, depending on the impedance of the second switch SW25, the impedance on the signal path may not be able to approach sufficiently close to the point ZO (indicated by the arrow L10 in FIG. 20A). For this reason, the second shunt switch SSW25 is turned ON so that the impedance at a node between the second switch SW25 and the second filter SAW25 is set to be the point ZS, and the impedance starts to move from the point ZS and approaches the point ZO by the impedance of the second switch SW25. This makes it possible to make the impedance closer to the open state (indicated by the arrow L11 in FIG. 20A) than when the second shunt switch SSW25 is turned OFF.

In contrast, when the impedance Z10 of the second filter SAW25 as seen from the common terminal P15 is capacitive (FIG. 20B), the impedance on the signal path is positioned in the lower half region on the Smith chart. In this case, by making the impedance start at this position to approach the point ZO by the impedance of the second switch SW25, the impedance can be closer to the open state (indicated by the arrow L13 in FIG. 20B) rather than by turning ON the second shunt switch SSW25 to cause the impedance to move back to the point ZS in the short state (indicated by the arrow L12 in FIG. 20B).

In this manner, the ON/OFF state of the second shunt switch SSW25 is changed according to whether the impedance of the second filter SAW25 as seen from the common terminal P15 is inductive or capacitive. It is thus possible to decrease a leakage of a signal to the second path, thereby reducing the insertion loss.

Second Modified Example of Fifth Embodiment

In the first modified example of the fifth embodiment, when the impedance of the second filter SAW25 as seen from the common terminal P15 is capacitive, the second shunt switch SSW25 is turned OFF. However, even when the impedance of the second filter SAW25 is capacitive, if the impedance is positioned in the transition band between the pass band and the stop band, loss may be incurred as a result of making the impedance approach the point ZO by using the impedance of the second switch SW25.

In a second modified example of the fifth embodiment, when the impedance of the second filter SAW25 is capacitive, the ON/OFF state of the second shunt switch SSW25 is changed according to the reflection coefficient of the second filter SAW25.

Figure 21:
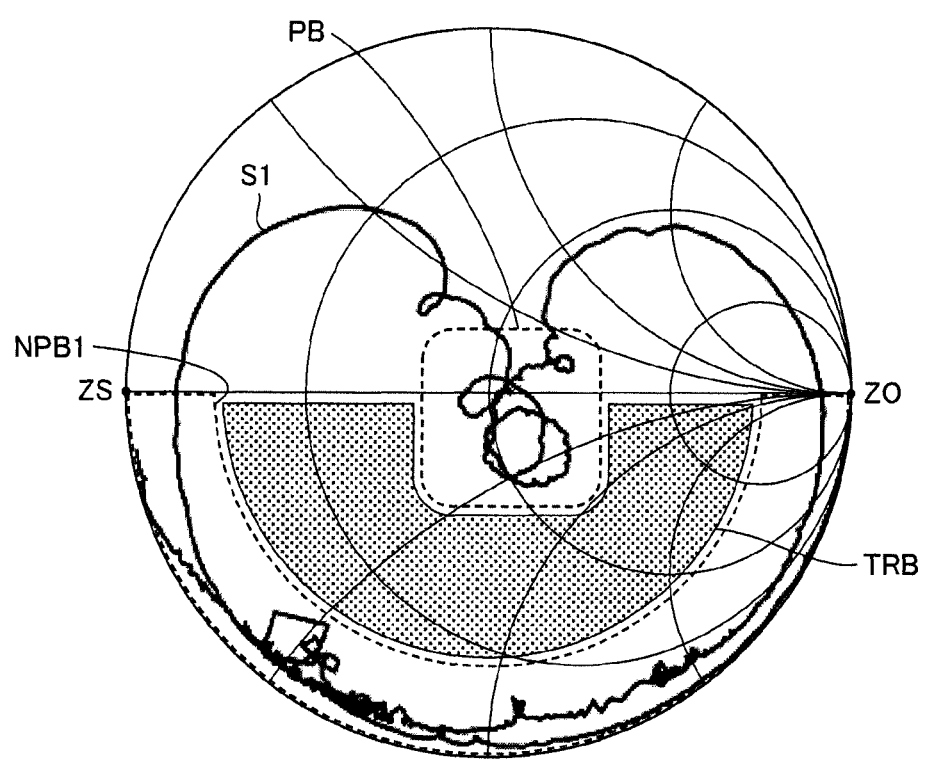
FIG. 21 is a Smith chart representing an impedance change on a signal path according to a second modified example of the fifth embodiment.

FIG. 21 is a Smith chart for explaining an impedance change on a signal path according to the second modified example of the fifth embodiment.

The reflection coefficient is the ratio of the amplitude of the reflected wave to that of the incident wave. On the Smith chart, as impedance is positioned closer to the pass band PB at the center, the reflection coefficient becomes smaller, and as impedance is positioned closer to the stop band NPB1 at the outer edge, the reflection coefficient becomes larger. The reflection coefficient in the stop band NPB1 is 0.8 or larger, for example. That is, when the second filter SAW25 has a large reflection coefficient and the impedance is positioned in the stop band NPB1, the second shunt switch SSW25 is OFF so that the impedance can approach closer to the open state with a small loss.

In contrast, when the second filter SAW25 has a small reflection coefficient and the impedance is in the transition band TRB, the second shunt switch SSW25 is turned ON so as to increase the reflection coefficient, thereby reducing the loss.

In this manner, when the impedance of the second filter SAW25 as seen from the common terminal P15 is capacitive, the ON/OFF state of the second shunt switch SSW25 is changed according to the reflection coefficient of the second filter SAW25. It is thus possible to further decrease a leakage of a signal to the second path, thereby further reducing the insertion loss.

Third Modified Example of Fifth Embodiment

In a third modified example of the fifth embodiment, a switch module having two common terminals will be described.

Figure 22:
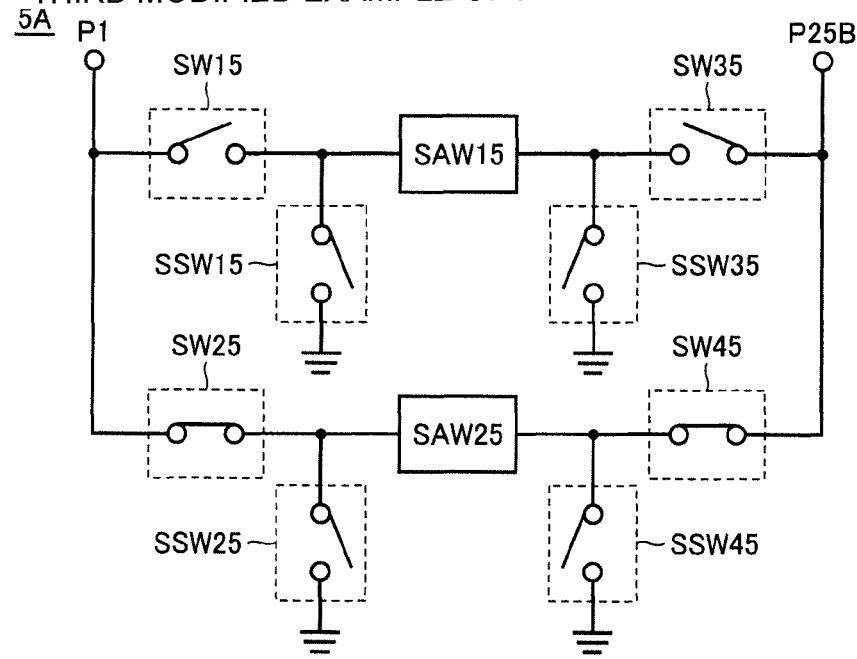
FIG. 22 is a circuit diagram of a switch module according to a third modified example of the fifth embodiment.

FIG. 22 is a circuit diagram of a switch module 5A according to the third modified example of the fifth embodiment. As shown in FIG. 22, the switch module 5A includes a common terminal P25B (second terminal), a third switch SW35, a fourth switch SW45, a third shunt switch SSW35, and a fourth shunt switch SSW45, in addition to the elements of the switch module 5 shown in FIG. 19.

The third and fourth switches SW35 and SW45 are connected to the common terminal P25B. The third switch SW35 is connected between the common terminal P25B and the first filter SAW15. The fourth switch SW45 is connected between the common terminal P25B and the second filter SAW25. The third shunt switch SSW35 is connected between ground and a path (third path) connecting the third switch SW35 and the first filter SAW15. The second shunt switch SSW45 is connected between ground and a path (fourth path) connecting the fourth switch SW45 and the second filter SAW25.

The third switch SW35 and the first switch SW15 are turned ON together or OFF together. When the first switch SW15 is ON, the third switch SW35 is also ON. When the first switch SW15 is OFF, the third switch SW35 is also OFF. Likewise, the fourth switch SW45 and the second switch SW25 are turned ON together or OFF together.

With this configuration, the third and fourth shunt switches SSW35 and SSW45 are controlled similarly to the first and second shunt switches SSW15 and SSW25, respectively. That is, when the first shunt switch SSW15 is ON, the third shunt switch SSW35 is also ON, and when the second shunt switch SSW25 is ON, the fourth shunt switch SSW45 is also ON. As the condition for changing the ON/OFF state of the shunt switches, one of the conditions discussed in the fifth embodiment and the first and second modified examples thereof may be employed.

In the third modified example of the fifth embodiment, it is possible to reduce the insertion loss of the switch module 5A.

The above-described embodiments may be combined in a suitable manner within a technically possible range. The disclosed embodiments are only examples and are not intended to be exhaustive or to limit the invention to the precise forms disclosed.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A switch module comprising:
   a first terminal;
   a first filter configured to pass a signal in a first frequency band;
   a second filter configured to pass a signal in a second frequency band;
   a first switch configured to selectively connect the first terminal to the first filter, the first terminal and the first filter being connected when the first switch is ON, and the first terminal and the first filter being disconnected when the first switch is OFF;
   a second switch configured to selectively connect the first terminal to the second filter, the first terminal and the second filter being connected when the second switch is ON, and the first terminal and the second filter being disconnected when the second switch is OFF;
   a first shunt switch connected between ground and a first path, the first path connecting the first switch and the first filter, and the first shunt switch being controlled independently of the first switch; and
   a second shunt switch connected between ground and a second path, the second path connecting the second switch and the second filter, and the second shunt switching being controlled independently of the second switch,
   wherein when the first switch is OFF, an ON/OFF state of the first shunt switch is controlled in accordance with a condition,
   wherein when the second switch is OFF, an ON/OFF state of the second shunt switch is controlled in accordance with the condition, and
   wherein the condition is whether a reflection coefficient of the second filter is greater than or equal to a predetermined value when the impedance of the second filter as seen from a first terminal is capacitive.

2. The switch module according to claim 1, wherein the condition is further whether the first frequency band and the second frequency band overlap.

3. The switch module according to claim 1, wherein the condition is further whether an impedance of the corresponding filter as seen from the first terminal is capacitive or inductive.

4. The switch module according to claim 1, wherein the predetermined value is 0.8.

5. The switch module according to claim 1, wherein:
   when the first switch is ON:
      the first shunt switch is OFF,
      the second shunt switch is ON when an impedance of the second filter as seen from the first terminal is inductive, and the second shunt switch is OFF when the impedance of the second filter as seen from the first terminal is capacitive.

6. The switch module according to claim 1, wherein when the first frequency band partially overlaps the second frequency band, and when the first switch is ON: the second switch and the first shunt switch are OFF while the second shunt switch is ON.

7. The switch module according to claim 1, wherein when the first frequency band does not overlap the second frequency band, and when the first switch is ON: the second switch, the first shunt switch, and the second shunt switch are OFF.

8. The switch module according to claim 1, wherein:
when the second switch and the second shunt switch are OFF, the second filter is capacitive; and
when the first switch is ON:
the first shunt switch is OFF,
the second shunt switch is OFF when a reflection coefficient of the second filter is greater than or equal to a predetermined value, and
the second shunt switch is ON when the reflection coefficient of the second filter is smaller than the predetermined value.

9. The switch module according to claim 8, wherein the predetermined value is 0.8.

10. The switch module according to claim 1, further comprising:
a second terminal;
a third switch configured to selectively connect the second terminal to the first filter, the second terminal and the first filter being connected when the third switch is ON, and the second terminal and the first filter being disconnected when the third switch is OFF;
a fourth switch configured to selectively connect the second terminal to the second filter, the second terminal and the second filter being connected when the fourth switch is ON, and the second terminal and the second filter being disconnected when the fourth switch is OFF;
a third shunt switch connected between ground and a third path, the third path connecting the third switch and the first filter, and the third shunt switch being controlled independently of the third switch; and
a fourth shunt switch connected between ground and a fourth path, the fourth path connecting the fourth switch and the second filter, and the fourth shunt switch being controlled independently of the fourth switch.

11. The switch module according to claim 10, wherein:
when the third switch is ON:
the third shunt switch is OFF,
the fourth shunt switch is ON when an impedance of the second filter as seen from the second terminal is inductive, and
the fourth shunt switch is OFF when the impedance of the second filter as seen from the second terminal is capacitive.

12. The switch module according to claim 10, wherein when the first frequency band partially overlaps the second frequency band, and when the third switch is ON: the fourth switch and the third shunt switch are OFF while the fourth shunt switch is ON.

13. The switch module according to claim 10, wherein when the first frequency band does not overlap the second frequency band, and when the third switch is ON: the fourth switch, the third shunt switch, and the fourth shunt switch are OFF.

14. The switch module according to claim 10, wherein:
when the fourth switch and the fourth shunt switch are OFF, the second filter is capacitive; and
when the third switch is ON:
the third shunt switch is OFF,
the fourth shunt switch is OFF when a reflection coefficient of the second filter is greater than or equal to a predetermined value, and
the fourth shunt switch is ON when the reflection coefficient of the second filter is smaller than the predetermined value.

15. The switch module according to claim 14, wherein the predetermined value is 0.8.

* * * * *